United States Patent [19]

Muroyama

[11] Patent Number: 5,248,629
[45] Date of Patent: Sep. 28, 1993

[54] PROCESS FOR FABRICATING CAPACITOR FOR SEMICONDUCTOR STORAGE DEVICE

[75] Inventor: Masakazu Muroyama, Kanagawa, Japan

[73] Assignee: Sony Corporation, Tokyo, Japan

[21] Appl. No.: 911,118

[22] Filed: Jul. 9, 1992

[30] Foreign Application Priority Data

Jul. 10, 1991 [JP] Japan .................................. 3-197240

[51] Int. Cl.⁵ .......................................... H01L 21/70
[52] U.S. Cl. ...................................... 437/52; 437/47; 437/60; 437/235; 437/919
[58] Field of Search ...................... 437/47, 48, 52, 60, 437/235, 919; 257/310

[56] References Cited

U.S. PATENT DOCUMENTS 4,855,801  8/1989  Kuesters .............................. 257/306
4,970,564  11/1990  Kimura et al. ...................... 257/306

FOREIGN PATENT DOCUMENTS 126264   5/1988  Japan .................................. 257/310
2-26761  9/1990  Japan .................................. 437/52

Primary Examiner—Tom Thomas
Attorney, Agent, or Firm—Hill, Steadman & Simpson

[57] ABSTRACT

A capacitor (12) of a semiconductor storage device, for example, dynamic RAM (11), comprises a storage node (31), a storage capacitance portion (32) formed of tantalum oxynitride film, and a plate (33). The tantalum oxynitride film is produced by a chemical vapor deposition (CVD) process using a reactant gas containing a dialkylaminotantalum. The capacitor exhibits reduced leakage current and enhanced charge storage capacity.

5 Claims, 2 Drawing Sheets

FIG. I
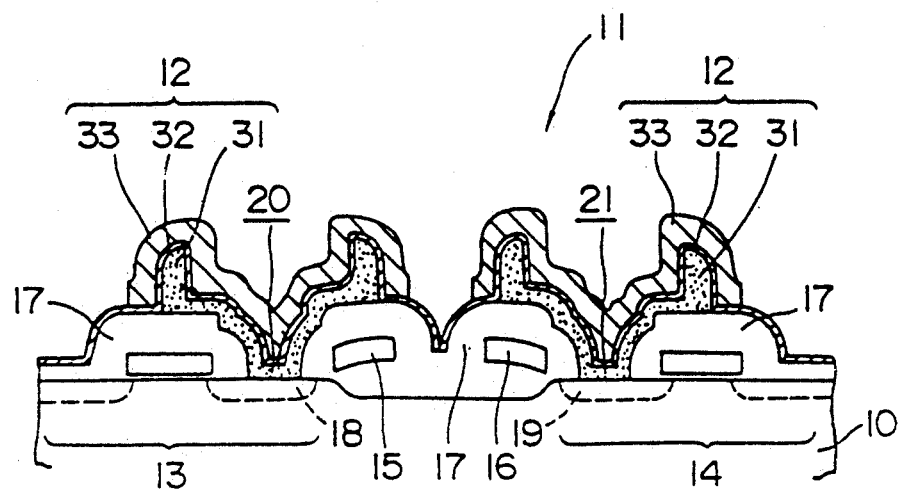
FIG. 2
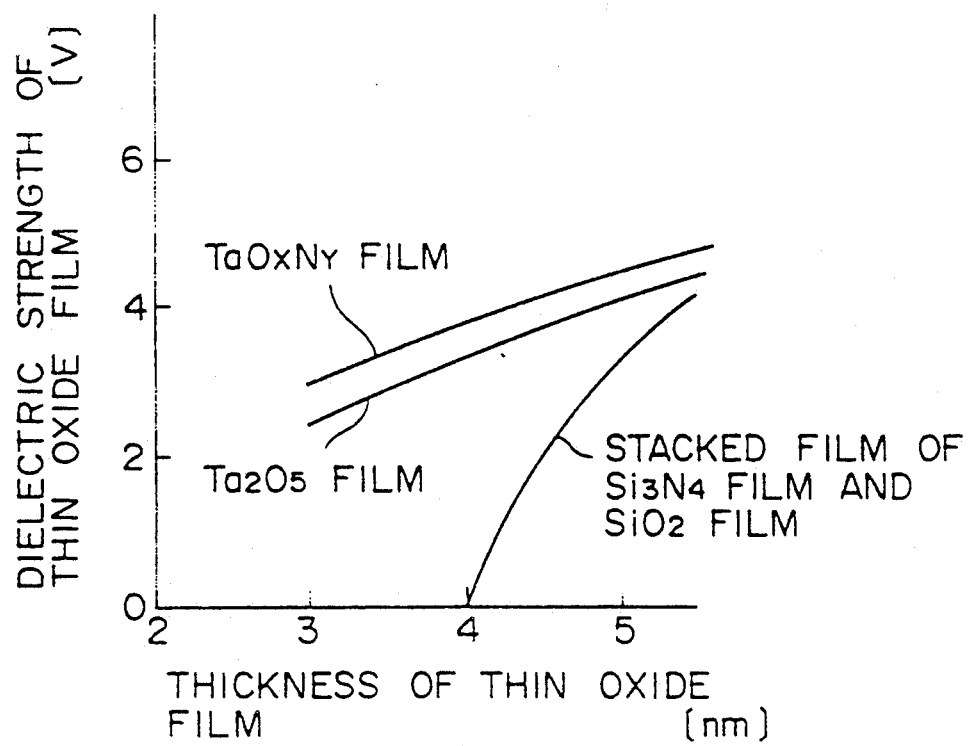

FIG. 3
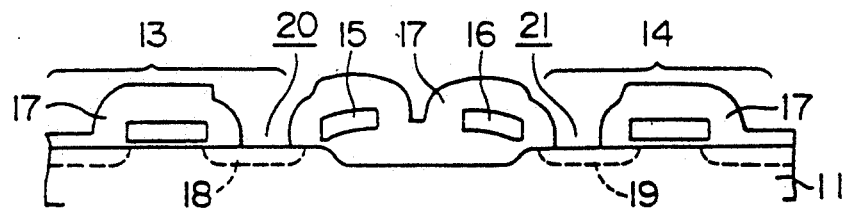
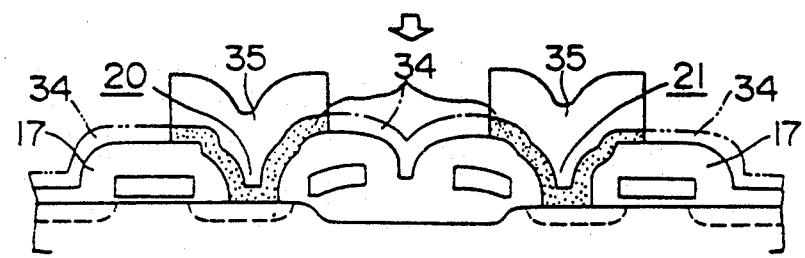
SUB-STEP (1) OF FIRST STEP
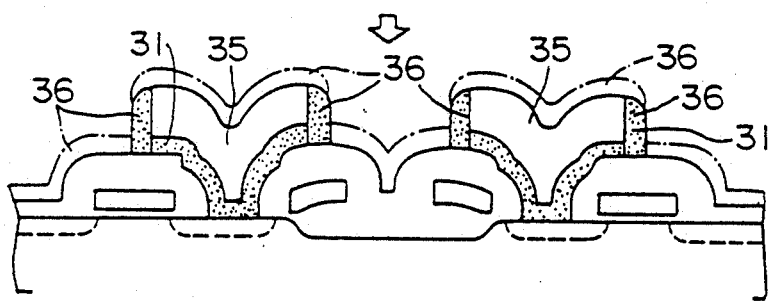
SUB-STEP (2) OF FIRST STEP
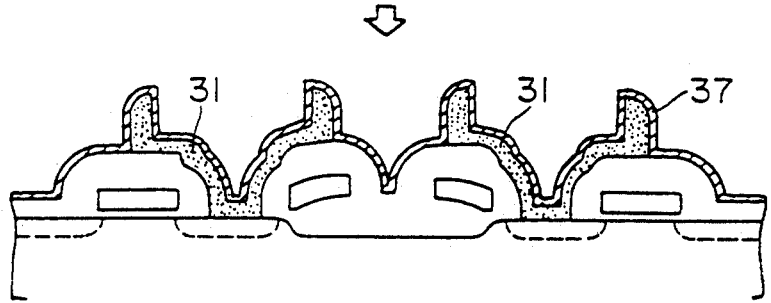
SECOND STEP
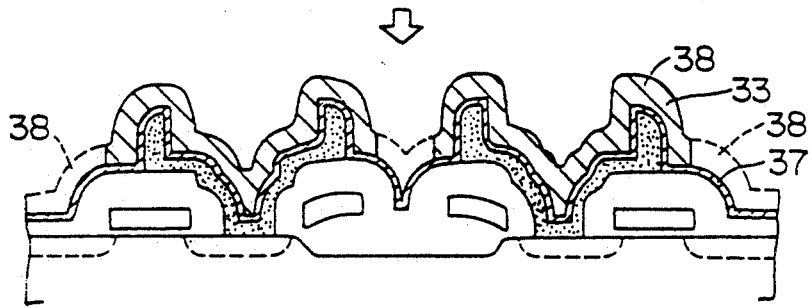
THIRD STEP

PROCESS FOR FABRICATING CAPACITOR FOR SEMICONDUCTOR STORAGE DEVICE

BACKGROUND OF THE INVENTION (1) Field of the Invention

This invention relates to a capacitor for semiconductor storage device and a process for fabricating the capacitor.

(2) Description of the Prior Art

In order to realize dynamic RAMs of higher integration, a variety of measures have been adopted against soft errors. According to one of the measures, the capacitors constituting a dynamic RAM are formed in three-dimensional structure to increase the capacitor surface area so that each capacitor can store an amount of signal charge with sufficient tolerance for soft-error noises. In the capacitor of such structure, however, the storage capacitance portion is formed in a steeply rugged area and, therefore, it is necessary that a capacitive dielectric film for forming the storage capacitance portion should have a very good step coverage property. From this point of view, a film of tantalum oxide ($Ta_2O_5$), which is a highly dielectric material, has been deposited by a chemical vapor deposition (CVD) process in order to form storage capacitance portions with good step coverage. The tantalum oxide film is formed by use of a reactant gas containing a metal-organic compound which shows rapid surface migration, such as methoxytantalum [$Ta(OCH_3)_5$] and ethoxytantalum [$Ta(OCH_2H_5)_5$].

Besides, in the recent semiconductor storage devices, there is a trend toward a lower power-supply voltage. A loss in charge storage capacity due to the lowered supply voltage is often compensated for by a reduction in the material thickness of storage capacitance portions.

Alternatively, a method of treating the storage capacitance portions with an ammonia ($NH_3$) plasma to introduce nitrogen into the storage capacitance portions is practiced, in order to compensate for the loss in charge storage capacity.

However, the capacitor as described above has the drawback that a reduction in the material thickness of the storage capacitance portion causes an increase in leakage current, leading to a lowered charge storage capability. Therefore, dynamic RAMs fabricated with such capacitors used to constitute storage capacitors are low in data storage performance.

To overcome this problem, a structure has been proposed in which the storage capacitance portions are formed by stacking a silicon oxide ($SiO_2$) film and a silicon nitride ($Si_3N_4$) film, thereby reducing leakage current. Even in the case of capacitors with this structure, if the material thickness of the storage capacitance portion is reduced to or below 50 nm, the dielectric strength is lowered greatly and leakage of currents occurs more frequently.

Furthermore, according to the method of introducing nitrogen into the storage capacitance portions by an ammonia ($NH_3$) plasma treatment, it is difficult to introduce a sufficient amount of nitrogen. Therefore, it is impossible to suppress satisfactorily the leakage of currents.

SUMMARY OF THE INVENTION

It is accordingly an object of this invention to provide a capacitor for semiconductor storage device which shows little leakage of current, and a process for fabricating the capacitor.

In order to attain the above object, this invention provides a capacitor for semiconductor storage device and a process for fabricating the capacitor, which follow.

The capacitor for semiconductor storage device according to this invention comprises a storage capacitance portion comprised of a tantalum oxynitride film between a storage node and a plate.

The capacitor is fabricated, according to this invention, by a process in which a storage node is first provided on a substrate. Next, a tantalum oxynitride film is deposited on the surface of the storage node by a chemical vapor deposition (CVD) process using a reactant gas containing a dialkylaminotantalum, to thereby form a storage capacitance portion. Subsequently, a plate is provided on the surface of the storage capacitance portion.

In the capacitor for semiconductor storage device constructed as above, the storage capacitance portion is composed of a tantalum oxynitride film and, therefore, has a high dielectric constant. Due to the high dielectric constant of the storage capacitance portion, stored charge is less liable to leak and there will be little leakage of currents.

Besides, according to the fabrication process as above, a tantalum oxynitride film is deposited by a CVD process using a reactant gas containing a dialkylaminotantalum, which is a metal-organic compound capable of rapid surface migration. The tantalum oxynitride film deposited in this manner has a step coverage quality comparable to that of tantalum oxide films obtained according to the prior art. It is therefore possible to achieve satisfactory covering of steep step portions of storage nodes.

The above and other objects, features and advantages of this invention will become apparent from the following description and the appended claims, taken in conjunction with the accompanying drawings.

BRIEF DESCRIPTION OF THE DRAWINGS

FIG. 1 is a schematic sectional view of a capacitor according to one embodiment of this invention;

FIG. 2 is a diagram showing the relationship between the dielectric strength and the material thickness of a thin oxide film, for different types of storage capacitance portion; and FIG. 3 is a drawing which shows the process steps for fabricating a capacitor according to one embodiment of this invention.

DESCRIPTION OF PREFERRED EMBODIMENTS

Some embodiments of this invention will now be described below with reference to the schematic sectional view shown in FIG. 1.

In the figure there is shown a capacitor 12 of three-dimensional structure in a dynamic RAM (hereinafter referred to as "DRAM") 11, which is a typical example of semiconductor storage device.

As shown in the figure, a plurality of transistors 13, 14 and word lines 15, 16 are provided on the upper side of a substrate 10. A layer insulation film 17 is provided so as to cover the transistors 13, 14 and the word lines 15, 16. The layer insulation film 17 is formed with contact holes 20, 21 for permitting connection to source/drain diffused layers 18, 19 of the transistors 13, 14.

A capacitor 12 is fabricated on the surface of the layer insulation film 17, inclusive of the inside wall surfaces of the contact holes 20, 21. The capacitor 12 comprises a storage node 31 connected to the source/drain diffused layers 18, 19 through the contact holes 20, 21; a storage capacitance portion 32 consisting of a film of tantalum oxynitride (hereinafter referred to as "TaOxNy", where x is a number having an arbitrarily set value, and y is a number in the range from 0.1x to x) deposited on the surface of the storage node 31; and a plate 33 provided on the surface of the storage capacitance portion 32. The storage node 31 and the plate 32 are both formed of polysilicon (hereinafter referred to as "poly-Si").

In the capacitor 12 with the above construction, the storage capacitance portion 32 is formed of a TaOxNy film and, because of nitrogen contained in the film, has a higher dielectric constant, as compared to a storage capacitance portion formed of a tantalum oxide ($Ta_2O_5$) film according to the prior art. Consequently, leakage current at the storage capacitance portion 32 is reduced.

In the next place, evaluation of the dielectric constant of capacitors 12 was carried out for the cases where the storage capacitance portion 32 of the capacitor 12 is formed of a TAOxNy film, a $Ta_2O_5$ film or a stacked film of a silicon nitride ($Si_3N_4$) film and a silicon oxide ($SiO_2$) film.

The evaluation was carried out as follows. First, a thin oxide film was formed on a silicon substrate. Next, a storage capacitance portion 32 was deposited on the thin oxide film in a thickness of 50 nm, followed by forming a poly-Si film pattern on the storage capacitance portion 32. Subsequently, the relationship between the dielectric strength of the thin oxide film, in terms of the voltage which causes a leakage current of $10^{-6}$ $A/cm^2$, and the thickness of the thin oxide film was examined, for each of the storage capacitance portions fabricated as above. The results are diagramed in FIG. 2.

In the diagram of FIG. 2, the ordinate indicates the dielectric strength of thin oxide film and the abscissa indicates the material thickness of the thin oxide film.

As is seen from the diagram, for a given oxide film thickness, the TaOxNy film exhibited a dielectric strength higher than those of the $Ta_2O_5$ film and the stacked film of $Si_3N_4$ layer and $SiO_2$ layer. It was thus confirmed that the TaOxNy film permits less leakage current, as compared to the other films.

Now, the process for fabricating the above-described capacitor 30 will be described below, with reference to the process step drawing shown in FIG. 3.

As shown in FIG. 3, a plurality of transistors 13, 14 and word lines 15, 16 are provided on a substrate 11 in the usual manner. Further, a layer insulation film 17 is formed in the condition of covering the transistors 13, 14 and the word lines 15, 16. The layer insulation film 17 is provided with contact holes 20, 21 for connection to source/drain diffused layers 18, 19 of the transistors 13, 14.

A capacitor 12 is then fabricated on the surface of the layer insulation film 17, inclusive of the inside wall surfaces of the contact holes 20, 21 formed as above.

In sub-step (1) of the first step in fabrication of the capacitor, a first poly-Si film 34 having a thickness of, for example, 200 nm is deposited on the surface of layer insulation film 17, inclusive of the inside wall surfaces of the contact holes 20, 21, by a CVD process. An $SiO_2$ film is then grown on the first poly-Si film 34 by a CVD process, and the $SiO_2$ film is processed by photolithographic and etching techniques, to form an $SiO_2$ pattern 35. Using the $SiO_2$ pattern 35 as a mask, an etching is applied to the first poly-Si film 34 to remove those portions of the film 34 which are indicated by two-dotted chain lines in the figure.

Subsequently, in sub-step (2) of the first step, a second poly-Si film 36 is deposited by a CVD process so as to cover the $SiO_2$ pattern 35. Thereafter, those portions of the second poly-Si film 36 which are indicated by one-dotted chain lines in the figure are etched away. Then, the $SiO_2$ pattern 35 is etched away.

In this manner, a storage node 31 (shaded in the figure) formed of the poly-Si film is produced.

Next, the second step is carried out. In this step, a TaOxNy film 37 is deposited by a CVD process, in a thickness of 50 nm so as to cover the storage node 31. In the CVD process, a dialkylaminotantalum [Ta{N(R)$_2$}$_5$], for example, dimethylaminotantalum [Ta{N(CH$_3$)$_2$}$_5$] in a flow rate of 50 sccm, methoxytantalum [Ta(OCH$_3$)5] in a flow rate of 300 sccm, and oxygen [$O_2$] in a flow rate of 300 sccm are introduced into a reaction chamber of a CVD apparatus (not shown) as reactant gas, to fill the reaction chamber with a reactant gas atmosphere at a pressure of, for instance, 133 Pa. A stage (not shown) for mounting the substrate 11 thereon is maintained at a temperature of, for example, 450° C. Under these conditions, the desired film is grown by the CVD process.

Alternatively, a CVD process may be carried out by supplying the reaction chamber with other reactant gas, for example, dimethylaminotantalum [Ta{N(CH$_3$)$_2$}$_5$] in a flow rate of 50 sccm, methoxytantalum [Ta(OCH$_3$)5] in a flow rate of 200 sccm, and tantalum chloride [$TaCl_5$] in a flow rate of 100 sccm to maintain a reactant gas atmosphere at a pressure of, for example, 133 Pa in the reaction chamber. In this case, also, the stage temperature is maintained at about 450° C. to thereby grow the desired film.

Subsequently, the third step is carried out. In this step, a third poly-Si film 38 is deposited on the TaOxNy film 37 in a thickness of, for example, 200 nm by a CVD process. The third poly-Si film 38 is then treated by photolithographic and etching techniques to remove those portions of the film 38 which are indicated by broken lines in the figure.

As described above, the capacitor 12 is composed of the plate 33 formed of the third poly-Si film 38, the storage capacitance portion 32 formed of the TaOxNy film 37 connected to the plate 33, and the storage node 31.

In the above-described fabrication process, the storage capacitance portion 32 is formed of the TaOxNy film 37 deposited by a CVD process; therefore, it is possible to adjust the nitrogen content of the TaOxNy film 37 to a predetermined level by controlling the flow rate of Ta[N(R)$_2$]$_5$ of the reactant gas. This enables the formation of a TaOxNy film 37 containing a sufficient amount of nitrogen and having a high dielectric constant. In addition, because the TaOxNy film 37 is formed by a CVD process using a metal-organic compound, the TaOxNy film 37 shows excellent step coverage quality.

In the formula Ta[N(R)$_2$]$_5$ of compounds used in the above fabrication processes, R is an alkyl group, for example, methyl group ($CH_3$), ethyl group ($C_2H_5$) or propyl group ($C_3H_7$).

Besides, although the above fabrication processes have been described with reference to the cases of using methoxytantalum [$Ta(OCH_3)_5$], other alkyltantalum such as ethoxytantalum [$Ta(OC_2H_5)_5$] can also be used.

What is claimed is:

1. A process for fabricating a capacitor for semiconductor storage device, said capacitor having a storage node, a storage capacitance portion, and a plate which are stacked on a substrate, and said storage capacitance portion being comprised of a tantalum oxynitride film, the process comprising:

a first step of forming said storage node on the substrate;

a second step of growing the tantalum oxynitride film on a surface of said storage node by a chemical vapor deposition process using a reactant gas containing a dialkylaminotantalum, so as to form said storage capacitance portion; and a third step of forming said plate on a surface of said storage capacitance portion.

2. The fabrication process according to claim 1, wherein the dialkylaminotantalum is dimethylaminotantalum.

3. The fabrication process according to claim 1, wherein the dialkylaminotantalum is diethylaminotantalum.

4. The fabrication process according to claim 1, wherein the dialkylaminotantalum is dipropylaminotantalum.

5. The fabrication process according to claim 1, wherein the quantity of the dialkylaminotantalum supplied in carrying out the chemical vapor deposition process is regulated so as to control the amount of nitrogen to be contained in the resulting tantalum oxynitride film.

* * * * *